(12) United States Patent
Yang et al.

(10) Patent No.: US 10,998,439 B2
(45) Date of Patent: May 4, 2021

(54) GATE DRIVER INTEGRATED CIRCUIT

(71) Applicant: Ningbo Semiconductor International Corporation, Ningbo (CN)

(72) Inventors: Weicheng Yang, Ningbo (CN); Liyan Yang, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 94 days.

(21) Appl. No.: 16/237,009

(22) Filed: Dec. 31, 2018

(65) Prior Publication Data

US 2020/0194586 A1 Jun. 18, 2020

Related U.S. Application Data

(63) Continuation of application No. PCT/CN2018/122253, filed on Dec. 20, 2018.

(30) Foreign Application Priority Data

Dec. 13, 2018 (CN) .......................... 201811525665.9

(51) Int. Cl.
*H01L 29/78* (2006.01)
*H01L 29/10* (2006.01)
*H01L 29/06* (2006.01)
*H01L 29/40* (2006.01)
*H01L 29/08* (2006.01)
*H01L 29/167* (2006.01)

(52) U.S. Cl.
CPC ........ *H01L 29/7823* (2013.01); *H01L 29/063* (2013.01); *H01L 29/0649* (2013.01); *H01L 29/0692* (2013.01); *H01L 29/0865* (2013.01); *H01L 29/0882* (2013.01); *H01L 29/1095* (2013.01); *H01L 29/404* (2013.01); *H01L 29/7831* (2013.01); *H01L 29/167* (2013.01)

(58) Field of Classification Search
None
See application file for complete search history.

(56) References Cited

U.S. PATENT DOCUMENTS

| 2011/0260247 | A1 | 10/2011 | Yang et al. |
| 2016/0126350 | A1* | 5/2016 | Uhlig .................. H01L 29/7835 257/339 |
| 2017/0365595 | A1 | 12/2017 | He et al. |
| 2018/0166567 | A1* | 6/2018 | Uhlig .................... H01L 29/665 |
| 2019/0035783 | A1* | 1/2019 | Kim .................. H01L 29/42368 |
| 2019/0259751 | A1* | 8/2019 | Pala ................ H01L 21/823418 |

(Continued)

FOREIGN PATENT DOCUMENTS

| CN | 102623489 A | 8/2012 |
| CN | 102723304 A | 10/2012 |

(Continued)

*Primary Examiner* — Alexander G Ghyka
(74) *Attorney, Agent, or Firm* — Anova Law Group, PLLC

(57) ABSTRACT

A gate driver integrated circuit is provided. The gate driver integrated circuit includes a first well region disposed at one side of a first gate structure near an isolation region, and a second gate structure between the first well region and the isolation region. The second gate structure is used to suppress a leakage current in a parasitic PN junction formed by a drift region between the first well region and the isolation region. A performance of the gate driver integrated circuit is improved.

18 Claims, 2 Drawing Sheets

(56) References Cited

U.S. PATENT DOCUMENTS

2020/0195248 A1* 6/2020 Yang .................. H01L 29/0619
2020/0295185 A1* 9/2020 Snyder ............... H01L 29/1095
2020/0381521 A1* 12/2020 Toh ..................... H01L 29/512

FOREIGN PATENT DOCUMENTS

| CN | 102790089 A | 11/2012 |
| CN | 103208522 A | 7/2013 |
| CN | 104037231 A | 9/2014 |
| CN | 107534055 A | 1/2018 |

* cited by examiner

GATE DRIVER INTEGRATED CIRCUIT

CROSS-REFERENCES TO RELATED APPLICATION

This application is a continuation application of PCT Patent Application No. PCT/CN2018/122253, filed on Dec. 20, 2018, which claims priority to Chinese patent applications No. 201811525665.9, filed on Dec. 13, 2018, the entirety of all of which is incorporated herein by reference.

FIELD OF THE DISCLOSURE

The present disclosure generally relates to the field of semiconductor technologies and more particularly, relates to a high-voltage gate driver integrated circuit.

BACKGROUND

A high-voltage gate driver integrated circuit involves power electronic device technologies and microelectronic technologies, and is one of the key components of mechatronics. The high-voltage gate driver integrated circuit is widely used in many applications, including electronic ballasts, motor drivers, dimmers, different power modules.

A high-voltage gate driver integrated circuit usually includes a high-voltage-side driver control module, a low-voltage-side driver control module, and a level-shift module. The low-voltage-side driver control module operates as a control signal portion under a normal voltage, while the high-voltage-side driver control module mainly includes a high-voltage control signal portion. The level-shift module is used to transmit low-voltage-side control signals to the high-voltage-side driver control module.

To implement above functions, a high-voltage gate driver integrated circuit is usually expected to have a high withstand voltage performance. In the meantime, with semiconductor technologies developing, a leakage current in a high-voltage gate driver integrated circuit should be decreased to further improve a performance of the high-voltage gate driver integrated circuit.

The disclosed devices and methods are directed to at least partially alleviate one or more problems set forth above and to solve other problems in the art.

SUMMARY

One aspect of the present disclosure provides a high-voltage gate driver integrated circuit. The high-voltage gate driver integrated circuit includes: a substrate; a drift region of a first doping type in the substrate; a ring-shaped isolation region of a second doping type penetrating through the drift region; a field effect transistor; a first well region of the second doping type; a reduced surface field region of the second doping type; and a second gate structure on the substrate. The drift region is extended from a surface of the substrate into a first depth position inside the substrate. The isolation region is extended into a second depth position in the substrate deeper than the first depth position and a portion of the substrate surrounded by the isolation region provides a device region. The field effect transistor is disposed in the device region, and includes a drain region of the first doping type, a source region of the first doping type, and a first gate structure. The first gate structure is formed on the surface of the substrate, and is disposed between the source region and the drain region. The source region is disposed in the first well region. A first end of the first gate structure near the source region covers a portion of the first well region. The reduced surface field region is disposed between the first gate structure and the drain region. The second gate structure is disposed between the isolation region and the first well region.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
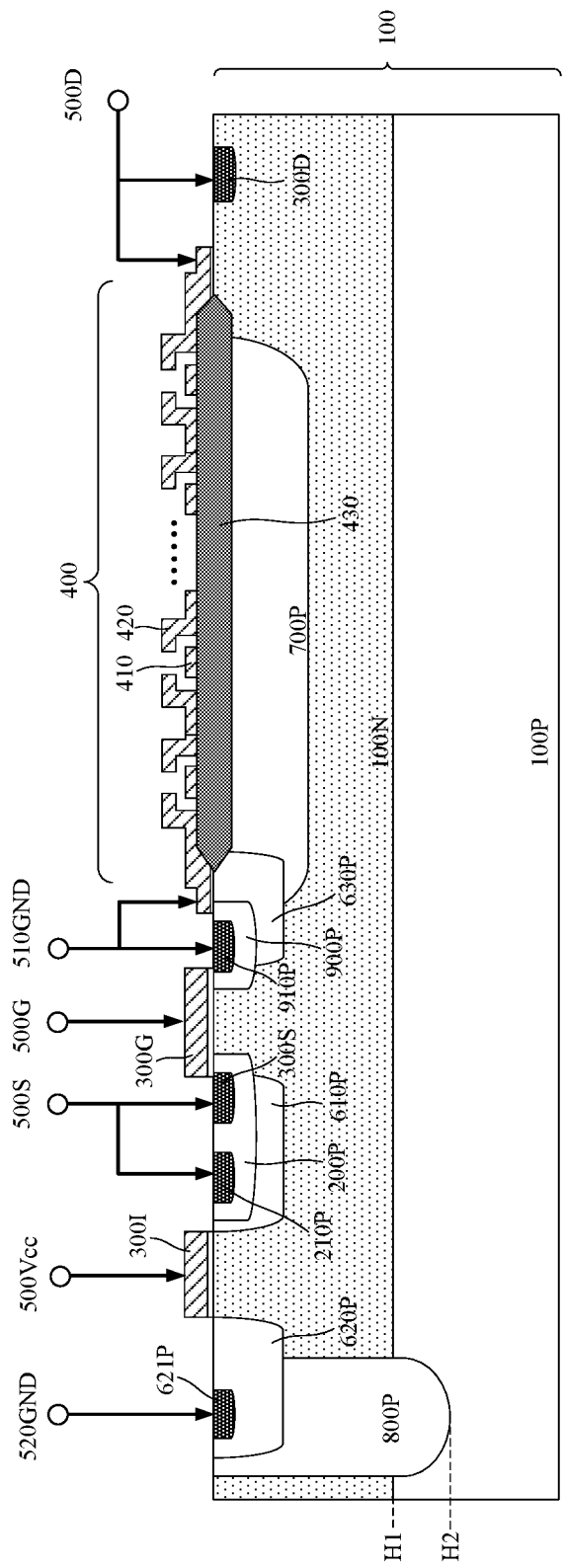
FIG. 1 illustrates a schematic diagram for an exemplary high-voltage gate driver integrated circuit consistent with various disclosed embodiments of the present disclosure.
Figure 2:
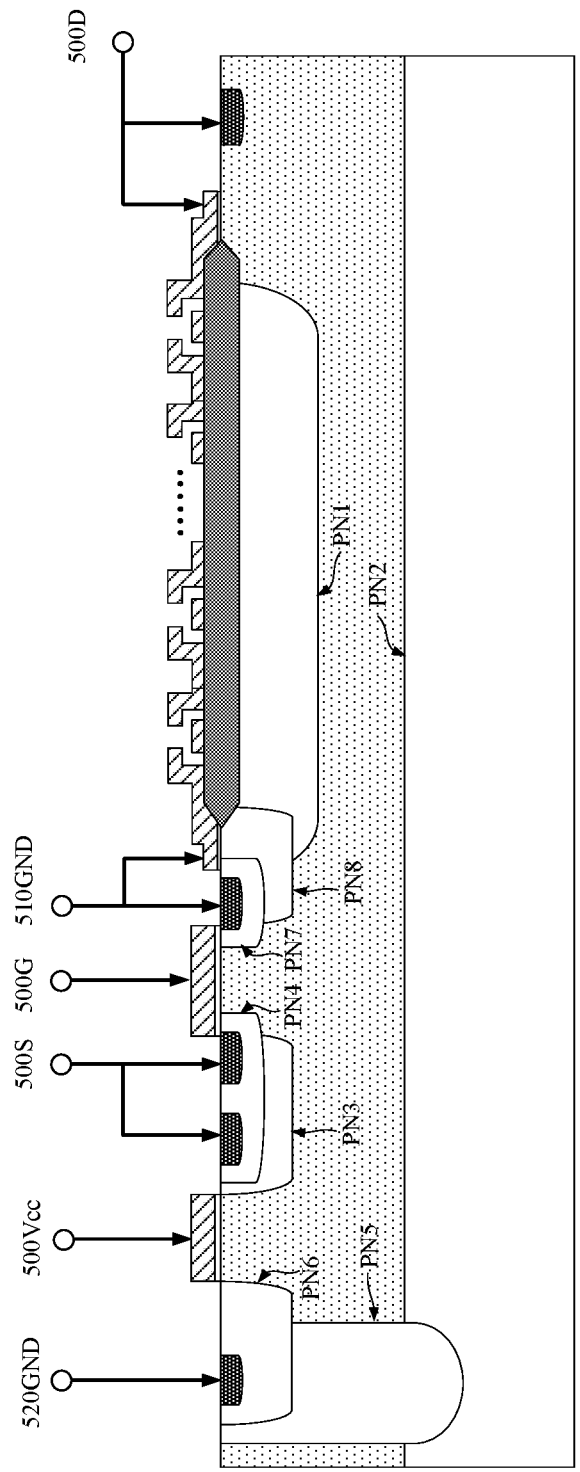
FIG. 2 illustrates an exemplary distribution of PN junctions in an exemplary high-voltage gate driver integrated circuit consistent with various disclosed embodiments of the present disclosure.

FIG. 1 illustrates a semiconductor structure for an exemplary high-voltage gate driver integrated circuit consistent with various disclosed embodiments of the present disclosure; and FIG. 2 illustrates an exemplary distribution of PN junctions in an exemplary high-voltage gate driver integrated circuit consistent with various disclosed embodiments of the present disclosure.

As illustrated in FIGS. 1-2, a high-voltage gate driver integrated circuit may include a substrate 100, a ring-shaped isolation region 800P of a second doping type, a field effect transistor, a first well region 200P of the second doping type, a reduced surface field (RESURF) region of the second doping type, and a second gate structure 300I.

The substrate 100 may include a drift region 100N of a first doping type. The drift region 100N may be extended from a surface of the substrate 100 to a first depth position H1 in the substrate 100.

The ring-shaped isolation region 800P may be formed in the substrate 100 penetrating through the drift region 100N and may be extended into a second depth position H2 in the substrate 100. The second depth position H2 may be lower/deeper than the first depth position H1. The ring-shaped isolation region 800P may define a device region. A portion of the substrate 100 surrounded by the ring-shaped isolation region 800P may be used as the device region.

The field effect transistor may be formed in the device region defined by the ring-shaped isolation region 800P. The field effect transistor may include a drain region 300D of the first doping type, a source region 300S of the first doping type, and a first gate structure 300G. The first gate structure 300G may be formed on the surface of the substrate 100 and be disposed between the source region 300S and the drain region 300D. The first gate structure 300G may be used to control a current flow between the source region 300S and the drain region 300D.

The first well region 200P may be formed in the drift region 100N inside the device region, and the source region 300S may be formed in the first well region 200P. The drain region 300D may be formed in the drift region 100N at one side of the first well region 200P away from the isolation region 800P. An end portion of the first gate structure 300G close to the source region 300S may cover a portion of the first well region 200P.

The reduced surface field region 700P may be formed in a portion of the substrate 100 in the device region. The reduced surface field region 700P may be disposed in the drift region 100N between the first gate structure 300G and the drain region 300D, to form the high-voltage gate driver circuit.

The second gate structure 300I may be formed on the surface of the substrate 100 between the isolation region 800P and the first well region 200P. The second gate structure 300I may be used to apply a reversed turn-on voltage to a parasitic PN junction formed by the drift region 100N between the isolation region 800P and the first well region 200P.

In one embodiment of the present disclosure, an isolation method based on the PN junction in the isolation region 800P may be used to isolate the device region (for example, used as a high-voltage region) from other regions (for example, low-voltage regions). The isolation region 800P may have a shape of a circle, and the device region surrounded by the isolation region 800P may have anyone of suitable shapes such as a circle, a square, or an ellipse. For description purposes only, the present disclosure is illustrated by using an embodiment where the isolation region 800P has a ring shape surrounding the field effect transistor and the device region surrounded by the isolation region 800P has a shape of a circle as an example, and it should not limit the scopes of the present disclosure.

In the high-voltage gate driver integrated circuit provided by various embodiments of the present disclosure, when applying a high voltage to the drain region 300D of the field effect transistor, a reversed voltage may be applied to PN junctions formed by the drift region 100N and other regions. Correspondingly, depletion layers in the PN junctions may diffuse to withstand the high voltage. In detail, a reversed voltage may be applied to a PN junction formed by the drift region 100N and the reduced surface field region 700P (that is, a first PN junction PN1 formed by the reduced surface field region 700P of the second doping type and the adjacent drift region 100N of the first doping type), and to the PN junction formed by the drift region 100N and the isolation region 800P (that is, a fifth PN junction PN5 formed by the isolation region 800P of the second doping type and the adjacent drift region 100N of the first doping type), respectively. Then the first PN junction PN1 and the fifth PN junction PN5 may be depleted.

In one embodiment, the isolation region 800P may be used to implement a PN junction isolation based on the formed PN junction, and may also further increase an area of the depletion layer of the formed PN junction to improve an anti-breakdown performance of the formed device.

The drift region 100N of the first doping type may be disposed between the first well region 200P of the second doping type and the isolation region 800P of the second doping type. Correspondingly, a parasitic PN junction may be formed in a portion of the drift region 100N under the second gate structure 300I. In one embodiment, the first well region 200P may be disposed close to the isolation region 800P. Then the first well region 200P, the isolation region 800P, and a portion of the drift region 100N between the first well region 200P and the isolation region 800P, may together form a parasitic PNP transistor.

The second gate structure 300I may be used to suppress a leakage current in the parasitic PNP transistor. The second gate structure 300I may be formed on the surface of the substrate 100 and may be disposed between the isolation region 800P and the first well region 200P. When applying a reversed turn-on voltage to the second gate structure 300I, a reversed turn-on voltage is applied to the parasitic PNP transistor. Then the parasitic PNP transistor may be turned off and the leakage current may be avoided.

In some embodiments, the second gate structure 300I may be connected to a power source region terminal 500Vcc. Then the reversed turn-on voltage may be continuously applied to the parasitic PNP transistor and the parasitic PNP transistor may be always kept off to prevent the leakage current.

In one embodiment, the substrate 100 may include a base substrate 100P of the second doping type and an epitaxial layer of the first doping type on the base substrate 100P. The epitaxial layer of the first doping type may be used as the drift region 100N. Then the isolation region 800P may penetrate through the epitaxial layer and be extended into the base substrate 100P. In one embodiment, the base substrate 100P may be P-type doped, and may have a resistivity of about 50 Ωcm to about 100 Ωcm.

In one embodiment, since the base substrate 100P and the drift region 100N may have opposite doping types, the base substrate 100P and the drift region 100N may also form a PN junction (a second PN junction) PN2. When a high voltage is applied to the gate driver integrated circuit, a depletion layer of the second PN junction PN2 may diffuse and an area of the depletion layer in the drift region 100N may be increased to withstand the high voltage. A high voltage withstand performance of the gate driver integrated circuit may be improved.

The first doping type and the second doping type may be opposite doping types. For example, the first doping type may be N-type and the second doping type may be P-type, or the first doping type may be P-type and the second doping type may be N-type. For description purpose only, the present disclosure is discussed by using an example where the first doping type is N-type and the second doping type is P-type. It should not limit the scope of the present disclosure and the first doping type and the second doping type may be any appropriate doping types.

In one embodiment, the epitaxial layer may be a single-layer epitaxial layer and the single-layer epitaxial layer may be further N-type doped to form the drift region 100N. The N-type doping process may use N-type doping ions including phosphor doping ions. A resistivity and a thickness of the drift region 100N may have an influence on the high voltage withstand performance of the gate driver integrated circuit. In one embodiment, the single-layer epitaxial layer after the N-type doping process may have a resistivity of about 2.5 Ωcm to about 3.5 Ωcm, and may have a thickness of about 15 μm to about 22 μm. The formed gate driver integrated circuit may have a good high voltage withstand performance (for example, may withstand a high voltage of about 200V to about 700 V).

In some other embodiments, the epitaxial layer may be a double-layer epitaxial layer including a bottom epitaxial layer and an upper epitaxial layer. The bottom epitaxial layer and the upper epitaxial layer may have different doping concentrations, and the bottom epitaxial layer may have a resistivity lower than a resistivity of the upper epitaxial layer. The bottom epitaxial layer may have a higher doping ion concentration to achieve a lower resistivity. When applying a high voltage to the gate driver integrated circuit, the bottom epitaxial layer with the higher doping concentration may benefit the depletion process in the PN junction formed by the bottom epitaxial layer and the base substrate 100P. The formed gate driver integrated circuit may have a good high voltage withstand performance.

In one embodiment, the bottom epitaxial layer may have a thickness of about 3 μm to about 5 μm and a resistivity of about 0.5 Ωcm to about 1.5 Ωcm, while the upper epitaxial layer may have a thickness of about 6 μm to about 11 μm and a resistivity of about 2.5 Ωcm to about 3.5 Ωcm.

In comparison with the single-layer epitaxial layer, in the double-layer epitaxial layer, the doping concentration of the bottom epitaxial layer and the doping concentration of the upper epitaxial layer may be changed independently. Then a good high voltage withstanding performance of the formed gate driver integrated circuit may be achieved with a smaller thickness, and the conduction performance of the field effect transistor may be improved simultaneously. A size of the formed device may be reduced. However, the single-layer epitaxial layer may be formed in a single epitaxial process and may have a fabrication process simpler than the double-layer epitaxial layer.

In one embodiment, a first contact region 210P of the second doping type may be further formed in the first well region 200P. The first contact region 210P may have an ion doping concentration larger than the ion doping concentration of the first well region 200P. Then a first signal wire may be connected to the first well region 200P through the first contact region 210P. Since the first contact region 210P may have the ion doping concentration larger than the ion doping concentration of the first well region 200P, a contact resistance between the first signal wire and the first well region 200P may be reduced. Since the first contact region 210P and the first well region 200P may have same doping types and may be electrically connected to each other, the first well region 200P will have a corresponding voltage when applying a voltage to the first contact region 210P.

In one embodiment, the first contact region 210P and the source region 300S may be electrically connected to a same signal terminal (for example, a first signal terminal 500S), to make the first well region 200P and the source region 300S under a same voltage. The first contact region 210P of the second doping type and the source region 300S of the first doping type may form a PN junction. When a voltage between two sides of the PN junction formed by the first contact region 210P and the source region 300S is a positive voltage, a leakage current may be formed between the first contact region 210P and the source region 300S. In one embodiment, the first well region 200P and the source region 300S may have a same voltage, and a positive voltage between two sides of the PN junction formed by the first contact region 210P and the source region 300S may be avoided to prevent the leakage current between the first contact region 210P and the source region 300S.

In some embodiments, the gate driver integrated circuit may further include a first deep junction region 610P. The first deep junction region 610P may be formed in the drift region 100N of the device region. The first deep junction region 610P may be disposed under the first well region 200P and may be connected to the first well region 200P to increase a depth of the junction corresponding to the position of the first well region 200P. In one embodiment, the first deep junction region 610 may be doped with P-type ions including boron ions. The first deep junction region 610 may have an ion doping concentration larger than the ion doping concentration of the first well region 200P.

Since the depth of the junction corresponding to the position of the first well region 200P may be increased, an interface of a PN junction corresponding to the position of the first well region 200P may extend into a deeper position in the substrate 100. When the first deep junction region 610P is not formed, the depth of the junction corresponding to the position of the first well region 200P may be a bottom boundary of the PN junction formed by the first well region 200P and the drift region 100N. After forming the first deep junction region 610P, the depth of the junction corresponding to the position of the first well region 200P may be a bottom boundary of the PN junction formed by the first deep junction region 610P and the drift region 100N. The depth of the junction corresponding to the first well region 200P and the drift region 100N may be lowered from the bottom position of the first well region 200P to the bottom position of the first deep junction region 610P by forming the first deep junction region 610P.

When the interface of the PN junction corresponding to the position of the first well region 200P extends into a deeper position in the substrate 100, an area of the PN junction may be increased and a depletion layer of the PN junction may diffuse into a larger area too. A voltage withstanding performance of the first well region 200P may be improved. The first deep junction region 610P may protect the first well region 200P from breakdown.

The first well region 200P may be used a portion of the field effect transistor. When the voltage withstanding performance of the first well region 200P is improved, an anti-breakdown performance of the field effect transistor may be improved too.

The first deep junction region 610P may be disposed under the first well region 200P, so the first deep junction region 610P may be formed at a position in the substrate deeper than the first well region 200P. In some embodiments, the first deep junction region 610P may be not only formed exactly under the first well region 200P, but may also be extended further along a width direction of the first deep junction region 610P. For example, a first side boundary of the first deep junction region 610P away from the gate structure may be extended further, to cover a first side boundary of the first well region 200P away from the gate structure.

In an exemplary embodiment, a second side boundary of the first deep junction region 610P close to the gate structure may not be extended into the substrate under the first gate structure 300G, so a portion of the first well region 200P covered by the first gate structure 300G may not overlap with the first deep junction region 610P. Correspondingly, the portion of the first well region 200P covered by the first gate structure 300G may extend out from the first deep junction region 610P, to form a channel region. The first deep junction region 610P may have no influence on the channel region since the first deep junction region 610P may not overlap with the channel region of the first well region 200P.

As illustrated in FIG. 2, a contact part between the first deep junction region 610P and the drift region 100N may form a third PN junction PN3, while a contacting part between the first well region 200P and the drift region 100N may form a fourth PN junction PN4. A depletion layer of the third PN junction PN3 and a depletion layer of the fourth PN junction PN4 may be connected to each other, and a breakdown voltage of the third PN junction PN3 and of the fourth PN junction PN4 may be improved.

The second side boundary of the first deep junction region 610P near the gate structure may not cover the second side boundary of the first well region 200P close to the first gate structure 300G. In one embodiment, the first side boundary of the first deep junction region 610P away from the first gate structure 300G may cover the first side boundary of the first well region 200P away from the first gate structure 300G. Then the first side boundary of the first deep junction region 610P away from the first gate structure 300G may be closer to the isolation region 800P than the first well region 200P.

In one embodiment, a distance between the first deep junction region 610P and the isolation region 800P is small. When the depletion layer of the fifth PN junction PN5 corresponding to the isolation region 800P and the depletion layer of the third PN junction PN3 corresponding to the first deep junction region 610P diffuse, the depletion layer of the fifth PN junction PN5 and the depletion layer of the third PN junction PN3 may be connected to each other more easily, and the anti-breakdown performance of the PN junctions may be improved.

As illustrated in FIG. 1, the gate driver integrated circuit may further include a second deep junction region 620P of the second doping type in the substrate 100. A portion of the second deep junction region 620P may be formed in the isolation region 800P and may extend into the device region along a direction toward the first well region 200P, then the isolation region 800P may be connected with the drift region 100N in the device region by the second deep junction region 620P. The second deep junction region 620P may have an ion doping concentration smaller than the ion doping concentration of the isolation region 800P.

In a high voltage device, the isolation region 800P usually may be formed by a heavily doped region, to achieve a good isolation performance. However, if the ion concentration in the isolation region 800P is too large, an electric field may aggregate structure easily in the interface between the isolation region 800P and the drift region 100N, especially at corners between the top boundary of the isolation region 800P and the surface of the substrate 100. Correspondingly, the device may break down easily. The second deep junction region 620P with a smaller ion doping concentration may be used to buffer a difference between the ion doping concentration of the isolation region 800P and the ion doping concentration of the drift region 100N. The second deep junction region 620P may be formed at the interface between the isolation region 800P and the drift region 100N, to cover at least a portion of the interface between the isolation region 800P and the drift region 100N. The breakdown at the interface between the isolation region 800P and the drift region 100N may be reduced effectively. In one embodiment, the second deep junction region 620P may be formed at the corners between the top boundary of the isolation region 800P and the surface of the substrate 100. Then the electric field may not aggregate structure at the corners between the top boundary of the isolation region 800P and the surface of the substrate 100.

The first deep junction region 610P and the second deep junction region 620P may be formed simultaneously by a same ion implantation process, and then the first deep junction region 610P and the second deep junction region 620P may have a same diffusion depth in the substrate. Correspondingly, the diffusion depth of the first deep junction region 610P in the substrate and the diffusion depth of the second deep junction region 620P in the substrate may both be larger than the diffusion depth of the first well region 200P in the substrate.

In some embodiments, a third contact region 621P may be formed in the second deep junction region 620P. The third contact region 621P may be used to lead the second deep junction region 620P, and may have an ion doping concentration larger than the ion doping concentration of the second deep junction region 620P to reduce a contact resistance between a sixth signal wire and the second deep junction region 620P.

As illustrated in FIG. 1 and FIG. 2, a portion of the second deep junction region 620P may be formed in the isolation region 800P and another portion of the second deep junction region 620P may extend into the drift region 100N to connect the isolation region 800P with the drift region 100N. Correspondingly, a contact part between the second deep junction region 620P and the drift region 100N may form a sixth PN junction PN6. A depletion layer of the sixth PN junction PN 6 may be connected to the depletion layer of the fifth PN junction PN 5. The voltage withstanding performance of the formed gate driver integrated circuit may be improved.

Since the second deep junction region 620P may extend from the isolation region 800P into the drift region 100N, the second deep junction region 620P may be closer to the first deep junction region 610P than the isolation region 800P. Then the depletion layer of the sixth PN junction PN 6 may be connected to the depletion layer of the third PN junction PN 3 more easily. Correspondingly, the depletion layer of the sixth PN junction PN 6, the depletion layer of the third PN junction PN 3, and the depletion layer of the fifth PN junction PN 5 may be connected to each other, to further improve the high voltage withstanding performance of the formed gate driver integrated circuit.

In the gate driver integrated circuit with the first deep junction region 610P and the second deep junction region 620P, the first side boundary of the first deep junction region 610P close to the isolation region 800P may cover the first side boundary of the first well region 200P close to the isolation region 800P and the second deep junction region 620P may be closer to the first deep junction region 610P than the isolation region 800P. Correspondingly, a parasitic PNP transistor may be easily formed between the P-type first deep junction region 610P, the N-type drift region 100N, and the P-type second deep junction region 620P. A leakage current may be formed between the first deep junction region 610P, the drift region 100N, and the second deep junction region 620P. The formed gate driver integrated circuit may have a bad performance.

In one embodiment, the second gate structure 300I may be formed to suppress the leakage current between the first deep junction region 610P, the drift region 100N, and the second deep junction region 620P. A reversed turn-on voltage may be applied to the second gate structure 300I, to turn off the parasitic PNP transistor formed by the first deep junction region 610P, the drift region 100N, and the second deep junction region 620P. The leakage current between the first deep junction region 610P, the drift region 100N, and the second deep junction region 620P, may be suppressed.

In some other embodiments without the first deep junction region 610P and the second deep junction region 620P, a parasitic transistor may be formed by the first well region 200P, the drift region 100N and the isolation region 800P. The second gate structure 300I between the first well region 200P and the isolation region 800P may suppress a leakage current between the first well region 200P, the drift region 100N and the isolation region 800P.

As illustrated in FIG. 1, the first gate structure 300G of the field effect transistor may be formed between the source region 300S and the drain region 300D on the substrate 100. The first gate structure 300G may extend along a direction toward the source region 300S to cover a portion of the source region 300S, and may also cover a portion of the first well region 200P at one side of the source region 300S close to the first gate structure 300G.

The portion of the first well region 200P covered by the first gate structure 300G may be used as the channel region. When the field effect transistor is turned on, the portion of the first well region 200P covered by the first gate structure 300G may be inverted to form a conductive channel, to achieve a current conduction of the field effect transistor.

The first contact region 210P in the first well region 200P may be formed at another side of the source region 300S away from the first gate structure 300G.

As illustrated in FIG. 1, the gate driver integrated circuit may further include a second well region 900P of the second doping type. The second well region 900P may be formed in the drift region 100N and may be disposed at one side of the first gate structure 300G away from the source region 300S. Correspondingly, the first well region 200P and the second well region 900P may be disposed at two sides of the first gate structure 300G respectively.

In one embodiment, the second well region 900P may extend into the substrate under the first gate structure 300G along a direction toward the first gate structure 300G. An end portion of the first gate structure 300G close to the source region 300S may partially cover the first well region 200P, and another end portion of the first gate structure 300G away from the source region 300S may partially cover the second well region 900P. One side boundary of the second well region 900P and one side boundary of the first well region 200P opposite to each other may be covered by two end portions of the first gate structure 300G respectively, and a distance between the second well region 900P and the first well region 200P may be small.

As illustrated in FIG. 2, a contact part between the second well region 900P and the drift region 100N may form a seventh PN junction PN7. Since the distance between the second well region 900P and the first well region 200P is small, the seventh PN junction PN7 may be disposed close to the fourth PN junction PN4, and the depletion layer of the seventh PN junction PN7 and the depletion layer of the fourth PN junction PN4 may be connected to each other, and a breakdown voltage of the seventh PN junction PN7 and of the fourth PN junction PN4 may be improved.

The gate driver integrated circuit may further include a third deep junction region 630P of the second doping type in the drift region of the device region. The third deep junction region 630P may be disposed under the second well region 900P and may be connected to the second well region 900P.

The third deep junction region 630P may partially overlap the second well region 900P, and may extend into a position in the substrate 100 deeper than the second well region 900P. A depth of a junction corresponding to the second well region 900P may be increased and a breakdown voltage of the second well region 900P may be improved. Correspondingly the second well region 900P may be protected and may not break down before isolating the high voltage.

The third deep junction region 630P may be disposed under the second well region 900P, and may extend into a position in the substrate 100 deeper than the second well region 900P. The third deep junction region 630P may not only be disposed exactly under the second well region 900P, but also may extend along a width direction of the third deep junction region 630P. For example, a side boundary of the third deep junction region 630P away from the gate structure may diffuse into the reduced surface field region 700P, to cover a side boundary of the second well region 900P away from the gate structure.

As illustrated in FIG. 2, a contact interface between the third deep junction region 630P and the drift region 100N may form an eighth PN junction PN8. The seventh PN junction PN7 may be disposed adjacent to the eighth PN junction PN8, and the depletion layer of the seventh PN junction PN7 and the depletion layer of the eighth PN junction PN8 may be connected to each other.

The first well region 200P and the second well region 900P may be simultaneously formed by a same ion implantation process, and the first well region 200P and the second well region 900P may have a same diffusion depth in the substrate 100. The first deep junction region 610P, the second deep junction region 620P, and the third deep junction region 630P may be simultaneously formed by a same ion implantation process.

As illustrated in FIG. 1, a second contact region 910P of the second doping type may be further formed in the second well region 900P. The second contact region 910P may have an ion doping concentration larger than an ion doping concentration of the second well region 900P. The second contact region 910P may be disposed to achieve a signal output/input with a low contact resistance for the second well region 900P.

When applying a high voltage on the source region 300D, a low voltage may be applied to the second well region 900P through the second contact region 910P. Since the third deep junction region 630P is connected to the second well region 900P, the third deep junction region 630P may also have a same low voltage, and the seventh PN junction PN7 and the eighth PN junction PN8 may be under a reversed voltage. Then the seventh PN junction PN7 and the eighth PN junction PN8 may be depleted.

As illustrated in FIG. 1, the gate driver integrated circuit may further include a field plate structure 400 on the substrate 100. The field plate structure 400 may be disposed between the first gate structure 300G and the drain region 300D. The field plate structure 400 may be used to achieve an electrical field regulation on a portion of the substrate 100 under the field plate structure 400, and to make the electrical field in the portion of the substrate 100 distributed along the field plate structure 400. An aggregation of the electrical field and a peak value of the electrical field may be alleviated. The high voltage withstanding performance of the formed gate driver integrated circuit may be improved.

When applying a high voltage to the drain region 300D, a portion of the substrate 100 corresponding to the drain region 300D may have an electrical field. Under the modulation of the field plate structure 400, the electrical field in the portion of the substrate 100 under the field plate structure 400 may diffuse from the drain region 300D toward a direction away from the drain region 300D. An electrical field aggregation at a position of the drain region 300D may be avoided, and a breakdown of the formed gate driver integrated circuit may be avoided.

In one embodiment, the field plate structure 400 may have a multilayer field plate structure, including a plurality of bottom conductive layers 410 and a plurality of upper conductive layers 420. Spaces between the bottom conductive layers 410 and the upper conductive layers 420 may be filled with capacitive dielectric layers. The bottom conductive layers 410, the upper conductive layers 420, and the capacitive dielectric layers may form coupling capacitors. The plurality of bottom conductive layers 410 and the plurality of upper conductive layers 420 may form a plurality of coupling capacitors. The plurality of coupling capacitors may be disposed sequentially along a direction from the drain region 300D to the source region 300S.

When applying a high voltage to the drain region 300D, a high voltage may be applied to a first end portion of the panel structure 400 close to the drain region 300D. A low voltage may be applied to a second end of the field plate structure 400 close to the source region 300S. Correspondingly, the first end portion of the panel structure 400 close to the drain region 300D may have a high voltage while the second end of the field plate structure 400 close to the source region 300S may have a low voltage. A coupling voltage of each coupling capacitor may gradually decrease from a first coupling capacitor closest to the drain region 300D to an N-th coupling capacitor closest to the source region 300S. A voltage of the field plate structure 400 may gradually decrease along a direction from the drain region 300D to the source region 300S. When achieving an electrical field modulation through the field plate structure 400, the electrical field strength in the portion of the substrate 100 under the field plate structure 400 may gradually decrease along a direction from the drain region 300D to the source region 300S.

In one embodiment, a shape of the bottom conductive layers 410 and a shape of the upper conductive layers 420 may be a circle. The N circular bottom conductive layers 410 may be disposed concentrically by using the drain region 300D as the circular centers. The N+1 circular upper conductive layers 420 may be disposed concentrically by using the drain region 300D as the circular centers, and may cover the bottom conductive layers 410. The field plate structure 400 may have a ring structure, and the drain region 300D may be disposed at the center position of the field plate structure 400 while the source region 300S may be disposed at outside of the field plate structure 400.

In some other embodiments, the field plate structure 400 may be a single-layer field plate structure. For example, in one embodiment, the field plate structure 400 may have a single conductive layer continuously extending from the drain region 300D to the source region 300S. When applying a high voltage to the first end of the field plate structure 400 close to the drain region 300D and a low voltage to the second end of the field plate structure 400 close to the source region 300S, the voltage of the field plate structure 400 may gradually decrease from the first end of the field plate structure 400 close to the drain region 300D to the second end of the field plate structure 400 close to the source region 300S because of voltage dividing by the resistance of the continuously extending conductive layer. In one embodiment, the continuously extending conductive layer in the field plate structure 400 may spirally extend away from the drain region 300D by using the drain region 300D as a center. Correspondingly the conductive layer may have a spiral structure. The embodiment above is used as an example to explain the present disclosure for description purposes only, and should not limit the scope of the present disclosure. The conductive layer may have any suitable structure/shape.

In another embodiment, the single layer field plate structure may include a plurality of field plates separated from each other. The plurality of field plates may be disposed in a same structure layer and may be disposed sequentially in a single layer along a direction from the drain region 300D to the source region 300S. A first field plate closest to the drain region 300D and a second field plate adjacent to the first field plate may form a first coupling capacitor. The second field plate and a third field plate adjacent to the second field plate may form a second coupling capacitor. In a same way, N coupling capacitors may be formed gradually along a direction away from the drain region 300D, until an N-th coupling capacitor formed between the N-th field plate near the source region 300S. When applying a voltage to the field plate structure 400, a coupling voltage of each coupling capacitor may gradually decrease from the first coupling capacitor to the N-th coupling capacitor. In some other embodiments, the plurality of independent conductive layers may be ring-shaped, and may be disposed concentrically by using the drain region 300D as a center. The formed field plate structure 400 may be a ring field plate structure, and the drain region 300D may be disposed at the center position of the field plate structure 400 while the source region 300S may be disposed at an outer side of the field plate structure 400.

In one embodiment, the first end of the field plate structure 400 close to the drain region 300D and the drain region 300D may be connected to a same signal terminal (for example, a second signal terminal 500D), while the second end of the field plate structure 400 close to the source region 300S and the second contact region 910P may be connected to another same signal terminal (for example, a third signal terminal 510GND). When applying a high voltage to the drain region 300D and the first end of the field plate structure 400 close to the drain region 300D, a low voltage may be applied to the second contact region 910P and the second end of the field plate structure 400 close to the source region 300S. Correspondingly, the electric field in the portion of the substrate 100 modulated by the field plate structure 400 may gradually decrease from the drain region 300D to the source region 300S, and the second well region 900P and the third deep junction region 630P may have a low voltage. Then the corresponding seventh PN junction PN7 and the eighth PN junction PN8 may be depleted.

As illustrated in FIG. 1, the reduced surface field region 700P may be disposed in the substrate 100 under the field plate structure 400, and between the first gate structure 300G and the drain region 300D.

In one embodiment, the doping type of the reduced surface field region 700P may be P-type and may be formed by Boron ion doping. A length of the reduced surface field region 700P from the drain region 300D to the source region 300S may be about 30 μm to about 80 μm.

As illustrated in FIG. 1, in one embodiment, the reduced surface field region 700P may extend into the second well region 900P along a direction toward the first gate structure 300G, and the reduced surface field region 700P may be connected to the second well region 900P. For example, the reduced surface field region 700P may partially overlap the second well region 900P to connect the reduced surface field region 700P with the second well region 900P. When applying a high voltage or a low voltage to the second well region 900P through the second contact region 910P, the reduced surface field region 700P may correspondingly have the high voltage or the low voltage. In one embodiment with the third deep junction region 630P, the third deep junction region 630P may be connected to the reduced surface field region 700P (or the third deep junction region 630P may be partially overlapped with the reduced surface field region 700P). Correspondingly, the second well region 900P, the third deep junction region 630P, and the reduced surface field region 700P may have a same or similar voltage.

As illustrated in FIG. 2, the field plate structure 400 may be disposed above the reduced surface field region 700P. When applying a voltage to the field plate structure 400, the electric field in the portion of the substrate 100 modulated by the field plate structure 400 may gradually decrease from the drain region 300D to the source region 300S, and an upper portion of the reduced surface field region close to an upper surface may form the first doping type region. Simultaneously, the reduced surface field region 700P may have a low voltage through the second contact region 910P, and then a reversed voltage may be formed on a first PN junction PN1 formed by the reduced surface field region and the drift region 100N. Correspondingly, a lower portion of the reduced surface field region 700P may be depleted because the reversed voltage may be applied to the first PN junction PN1.

As illustrated in FIG. 1 and FIG. 2, the reduced surface field region 700P may have the second doping type (for example, P type), and the drift region 100N may have the first doping type (for example, N type). Correspondingly, the reduced surface field region 700P and the drift region 100N may form the first PN junction PN1. An interface between the reduced surface field region 700P and the drift region 100N may be depleted to form a depletion layer of the first PN junction PN1. An area of the depletion layer in the drift region 100N may be increased and a high voltage withstanding performance may be improved. A voltage withstanding performance of the formed diffusing field effect transistor may be improved too.

In one embodiment, the base substrate 100P of the second doping type may be disposed in the substrate 100. The base substrate 100P of the second doping type may be under and in contact with the drift region 100N. Then the base substrate 100P and the drift region 100N may form a second PN junction PN2. When applying a high voltage to the drain region 300D, the depletion layer in the first PN junction PN1 and the depletion layer in the second PN junction PN2 may both diffuse, and the area of the depletion layer in the drift region 100N may be increased further.

In one embodiment, the first PN junction PN1 may be disposed above the second PN junction PN2, and a first portion of the depletion layer in the drift region 100N corresponding to the first PN junction PN1 and a second portion of the depletion layer in the drift region 100N corresponding to the second PN junction PN2 may diffuse close to each other. In detail, the first portion of the depletion layer in the drift region 100N corresponding to the first PN junction PN1 may diffuse toward the second PN junction PN2, and the second portion of the depletion layer in the drift region 100N corresponding to the second PN junction PN2 may diffuse toward the first PN junction PN1. The first portion of the depletion layer in the drift region 100N corresponding to the first PN junction PN1 may be connected to the second portion of the depletion layer in the drift region 100N corresponding to the second PN junction PN2. In one hand, the area of the depletion layer in the drift region 100N may be increased further. In another hand, when the first portion of the depletion layer in the drift region 100N corresponding to the first PN junction PN1 is connected to the second portion of the depletion layer in the drift region 100N corresponding to the second PN junction PN2, the source region 300S and the drain region 300D may be pinched off between the source region 300S and the drain region 300D. Then the high voltage region corresponding to the drain region 300D and the low voltage region corresponding to the source region 300S may be separated from each other. The high voltage may be isolated. A breakdown of the field effect transistor may be avoided, and the high voltage withstanding performance of the formed gate driver integrated circuit may be improved.

In one embodiment, a side boundary of the third deep junction region 630P close to the reduced surface field region 700P may extend into the reduced surface field region 700P. When applying a high voltage to the device, the depletion layer in the first PN junction PN1, the depletion layer in the seventh PN junction PN7, and the depletion layer in the eighth PN junction PN8 may be connected to each other. A breakdown voltage of the PN junctions may be enhanced, and a breakdown of the PN junctions before isolating the high voltage may be avoided.

As illustrated in FIG. 1, the gate driver integrated circuit may further include a field oxidation layer 430. A portion of the field oxidation layer 430 may be embedded in the substrate 100, and may be disposed between the source region 300S and the drain region 300D. The field oxidation layer 430 may be formed by a local oxidation of silicon (LOCOS) process. In one embodiment, the substrate 100 may be a silicon substrate and correspondingly the field oxidation layer 430 may be a silicon oxide layer. At least another portion of the field oxidation layer 430 may be formed on the substrate 100.

As illustrated in FIG. 1, the gate driver integrated circuit may further include a plurality of signal wires. The plurality of signal wires may include: a ninth signal wire connecting the source region 300S, a first signal wire connecting the first contact region 210P, a third signal wire connecting the drain region 300D, a fourth and a five signal wire connecting the field plate structure 400, a second signal wire connecting the second contact region 910P, a sixth signal wire connecting the third contact region 621P, a seventh signal wire connecting the first gate structure 300G, and an eighth signal wire connecting the second gate structure 300I.

The ninth signal wire may be connected to the first signal terminal 500S. The first signal wire may also be connected to the first signal terminal 500S, and may be used to further control the voltage of the first well region 200P and the first deep junction region 610P. Then the source region 300S and the first well region 200P may have a same voltage, and a leakage current between the source region 300S and the first well region 200P may be avoided when the field effect transistor is turned on. The third signal wire may be connected to a second signal terminal 500D. The fourth signal wire may be connected to the second end of the field plate structure 400 close to the source region 300S, and the fifth signal wire may be connected to the first end of the field plate structure 400 close to the drain region 300D. The fifth signal wire may also be connected to the second signal terminal 500D. The second signal wire may be connected to the third signal terminal 510GND to further control the voltage of the second well region 900P, of the third deep junction region 630P, and of the reduced surface field region 700P. The fourth signal wire of the field plate structure 400 close to the source region 300S may also be connected to the third signal terminal 510GND. The third signal terminal 510GND may be a ground terminal. The sixth signal wire may be connected to a fourth signal terminal 520GND, and the fourth signal terminal 520GND may be another ground terminal. The seventh signal wire may be connected to a fifth signal terminal 500G to control a turn-on/turn-off of the gate driver integrated circuit. The eighth signal wire may be connected to a sixth signal terminal. The sixth signal terminal may be a power source region terminal 500Vcc. The power source region terminal 500Vcc may provide a reversed turn-on voltage for the parasitic PN junctions.

The fifth signal wire of the field plate structure 400 and the third signal wire may both be connected to the second signal terminal 500D, while the fourth signal wire of the field plate structure 400 and the second contact region 910P may both be connected to the third signal terminal 510GND. When applying a high voltage to the second signal terminal 500D, the first end of the field plate structure 400 close to the drain region 300D and the drain region 300D may both have a high voltage, while the second end of the field plate structure 400 close to the source region 300S may have a ground voltage.

As disclosed, the technical solutions of the present disclosure have the following advantages. In the gate driver integrated circuit provided by various embodiments of the present disclosure, the first well region may be disposed at one side of the first gate structure close to the isolation region, and may be closer to the isolation region than the first gate structure. Since the drift region with the opposite doping type may be disposed between the first well region and the isolation region, a parasitic PN junction may be easily formed by the drift region between the first well region and the isolation region, and a leakage current may appear easily. The second gate structure may be disposed between the first well region and the isolation region, and may be used to suppress the leakage current in the parasitic PN junction. A performance of the formed gate driver integrated circuit may be improved.

Further, the first deep junction region and the second deep junction region may be disposed in the gate driver integrated circuit provided by various embodiments of the present disclosure. The first deep junction region may increase the depth of the junction of the PN junction corresponding to the first well region, and the breakdown voltage of the PN junction corresponding to the first well region. The second deep junction region may extend close to the first well region, and a distance between the first deep junction region and the second deep junction region may be reduced. Correspondingly, the depletion layer corresponding to the first deep junction region and the depletion layer corresponding to the second deep junction region may be easily connected to each other. The voltage withstanding performance of the PN junctions may be improved further. The second gate structure may suppress the leakage current between the first deep junction region and the second deep junction region. The formed gate driver integrated circuit may withstand a high voltage (for example, a voltage of about 200V to about 700 V), and the leakage current in the formed gate driver integrated circuit may be suppressed simultaneously.

The formed gate driver integrated circuit may be a level-shift circuit. Since the level-shift circuit may be used to transmit low-voltage control signals of a control circuit to a high-voltage driver circuit, the level-shift circuit may be connected to the high-voltage driver circuit. The level-shift circuit provided by various embodiment of the present disclosure may have a small leakage current and a good voltage withstanding performance. A performance of the formed level-shift circuit may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A gate driver integrated circuit, comprising:
 a substrate including a drift region of a first doping type, wherein the drift region is extended from a surface of the substrate into a first depth position inside the substrate;
 an isolation region of a second doping type penetrating through the drift region, wherein the isolation region of a ring shape is extended into a second depth position in the substrate deeper than the first depth position and a portion of the substrate surrounded by the isolation region provides a device region;
 a field effect transistor in the device region, the field effect transistor including a drain region of the first doping type, a source region of the first doping type, and a first gate structure, wherein the first gate structure is formed on the substrate and is disposed between the source region and the drain region;
 a first well region of the second doping type, wherein the source region is disposed in the first well region and a first end of the first gate structure near the source region covers a portion of the first well region;
 a reduced surface field region of the second doping type between the first gate structure and the drain region; and
 a second gate structure on the substrate, wherein the second gate structure is disposed between the isolation region and the first well region.

2. The circuit according to claim 1, further including:
 a first deep junction region of the second doping type, wherein the first deep junction region is disposed under the first well region and is connected to the first well region.

3. The circuit according to claim 1, further including:
 a second deep junction region of the second doping type, wherein:
 a portion of the second deep junction region is disposed in the isolation region and extended into the device region in a direction toward the first well region; and
 an ion doping concentration of the second deep junction region is smaller than an ion doping concentration of the isolation region.

4. The circuit according to claim 3, wherein the second gate structure is disposed between the second deep junction region and the first well region.

5. The circuit according to claim 1, further including a second well region of the second doping type, wherein:
 the first well region and the second well region are disposed corresponding to two ends of the first gate structure, respectively, and
 a second end of the first gate structure away from the source region partially covers the second well region.

6. The circuit according to claim 5, wherein the second well region is connected to the reduced surface field region.

7. The circuit according to claim 5, further including a third deep junction region of the second doping type, wherein the third deep junction region is disposed under the second well region and is connected to the second well region.

8. The circuit according to claim 1, further including a field plate structure on the surface of the substrate and above the reduced surface field region.

9. The circuit according to claim 8, wherein:
 the field plate structure includes:
 N bottom conductive layers, disposed sequentially from the drain region to the source region;
 a capacitive dielectric layer, covering a sidewall and a top of each bottom conductive layer; and
 N+1 upper conductive layers;
 wherein:
 each upper conductive layer is disposed on the capacitive dielectric layer;

a first upper conductive layer at one end of the field plate structure covers a first bottom conductive layer;

an (N+1)-th upper conductive layer at another end of the field plate structure covers an N-th bottom conductive layer;

two ends of each upper conductive layer between the first upper conductive layer and the (N+1)-th upper conductive layer cover two adjacent bottom conductive layer respectively; and N is a positive integer greater than or equal to 1.

10. The circuit according to claim 8, wherein:

the field plate structure includes a plurality of conductive layers separated from each other; and the plurality of conductive layers are disposed in a same layer and are sequentially disposed as a single layer along a direction from the drain region to the source region.

11. The circuit according to claim 8, wherein;

the field plate structure includes a continuously extended conductive layer, and the conductive layer is extended along a direction from the drain region to the source region.

12. The circuit according to claim 1, wherein;

the substrate includes a base substrate of the second doping type and an epitaxial layer of the first doping type on the base substrate; and the epitaxial layer is used as the drift region.

13. The circuit according to claim 12, wherein:

the epitaxial layer includes a bottom epitaxial layer and an upper epitaxial layer; and the upper epitaxial layer has a resistivity higher than a resistivity of the bottom epitaxial layer.

14. The circuit according to claim 13, wherein the upper epitaxial layer has the resistivity of about 0.5 Ωcm to about 1.5 Ωcm, and the bottom epitaxial layer has the resistivity of about 2.5 Ωcm to about 3.5 Ωcm.

15. The circuit according to claim 12, wherein the epitaxial layer is a single layer structure and has a resistivity of about 2.5 Ωcm to about 3.5 Ωcm.

16. The circuit according to claim 1, further including:

a first contact region, disposed in the first well region at a side of the source region away from the first gate structure.

17. The circuit according to claim 1, wherein the drain region has a withstand voltage of about 200 V to about 700 V.

18. The circuit according to claim 1, wherein the gate driver integrated circuit is a level-shift circuit.

* * * * *